(12) United States Patent
Noguchi

(10) Patent No.: US 12,040,362 B2
(45) Date of Patent: Jul. 16, 2024

(54) LAMINATE SUBSTRATE, FREESTANDING SUBSTRATE, METHOD FOR MANUFACTURING LAMINATE SUBSTRATE, AND METHOD FOR MANUFACTURING FREESTANDING SUBSTRATE

(71) Applicant: SHIN-ETSU CHEMICAL CO., LTD., Tokyo (JP)

(72) Inventor: Hitoshi Noguchi, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 691 days.

(21) Appl. No.: 16/696,039

(22) Filed: Nov. 26, 2019

(65) Prior Publication Data

US 2020/0176570 A1 Jun. 4, 2020

(30) Foreign Application Priority Data

Dec. 4, 2018 (JP) ................................. 2018-227436

(51) Int. Cl.
*H01L 29/16* (2006.01)
*C30B 23/02* (2006.01)
(Continued)

(52) U.S. Cl.
CPC ........ *H01L 29/1602* (2013.01); *C30B 23/025* (2013.01); *C30B 25/18* (2013.01); *C30B 29/04* (2013.01); *C30B 29/68* (2013.01); *H01L 21/0242* (2013.01); *H01L 21/02433* (2013.01); *H01L 21/02491* (2013.01); *H01L 21/02527* (2013.01); *H01L 21/02609* (2013.01);
(Continued)

(58) Field of Classification Search
CPC ........ Y10T 428/30; B82Y 30/00; B82Y 40/00
USPC .......................................... 428/408; 423/448
See application file for complete search history.

(56) References Cited

U.S. PATENT DOCUMENTS

2013/0143022 A1  6/2013  Schreck et al.
2018/0223447 A1  8/2018  Noguchi et al.

FOREIGN PATENT DOCUMENTS

CN          108400157 A     8/2018
DE   10 2010 023 952 A1    12/2011
(Continued)

OTHER PUBLICATIONS

Apr. 1, 2020 Extended European Search Report issued in European Patent Application No. 19213606.7.
(Continued)

*Primary Examiner* — Daniel H Miller
(74) *Attorney, Agent, or Firm* — Oliff PLC

(57) ABSTRACT

A laminate substrate which includes a single crystal diamond (111) layer, including: an underlying substrate, an intermediate layer on the underlying substrate, and the single crystal diamond (111) layer on the intermediate layer, in which the underlying substrate has a main surface which has an off angle within a range, −8.0° or more and −0.5° or less, or +0.5° or more and +8.0° or less in a crystal axis [_1_1 2] direction or a threefold symmetry direction thereof relative to a crystal plane orientation of (111), and the single crystal diamond (111) layer has an off angle within a range, more than −10.5° and less than −2.0°, or more than +2.0° and less than +10.5° in the crystal axis [_1_1 2] direction or a threefold symmetry direction thereof relative to the crystal plane orientation of (111).

10 Claims, 1 Drawing Sheet

(51) Int. Cl.
- *C30B 25/18* (2006.01)
- *C30B 29/04* (2006.01)
- *C30B 29/68* (2006.01)
- *H01L 21/02* (2006.01)
- *H01L 29/04* (2006.01)
- *B82Y 30/00* (2011.01)
- *C30B 29/02* (2006.01)
- *C30B 29/16* (2006.01)

(52) U.S. Cl.
CPC ............ *H01L 29/045* (2013.01); *B82Y 30/00* (2013.01); *C30B 29/02* (2013.01); *C30B 29/16* (2013.01)

(56) References Cited

FOREIGN PATENT DOCUMENTS

| | | |
|---|---|---|
| EP | 3 358 049 A1 | 8/2018 |
| JP | H11-106290 A | 4/1999 |
| JP | 2018-127367 A | 8/2018 |

OTHER PUBLICATIONS

Aug. 17, 2021 Office Action issued in Japanese Patent Application No. 2018-227436.
M.Hatano et al., Oyo Buturi vol. 85, No. 4, pp. 311-316 (2016).
May 30, 2023 Office Action issued in Japanese Application 2022-067491.
Jan. 25, 2022 Decision of Refusal issued in Japanese Patent Application No. 2018-227436.
Sep. 21, 2022 Office Action issued in European Application No. 19 213 606.7.
Gallheber B-C et al, "Propagation of threading dislocations in heteroepitaxial diamond films with (111) orientation and their role in the formation of intrinsic stress", Journal of Applied Physics, American Institute of Physics, vol. 121, No. 22, Jun. 9, 2017 (Jun. 9, 2017), XP012219566, ISSN: 0021-8979, DOI: 10.1063/1.4985174.
Oct. 23, 2023 Office Action issued in Chinese Application No. 201911222448.7.
Oct. 31, 2023 Office Action issued in Japanese Application No. 2022-067491.

[FIG. 1]
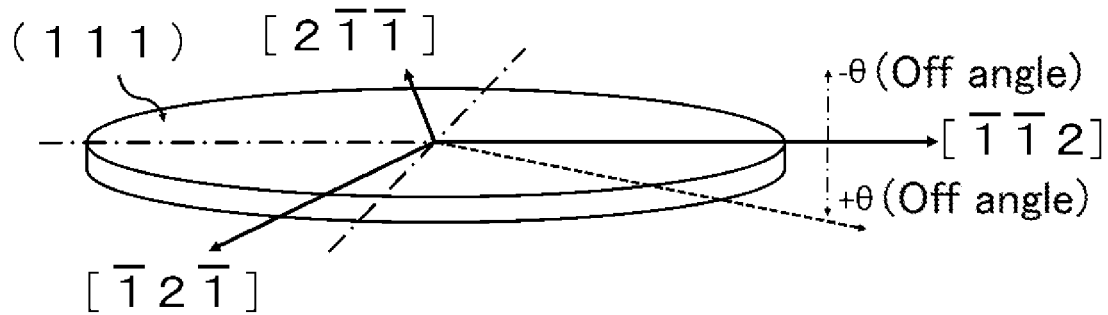
[FIG. 2]
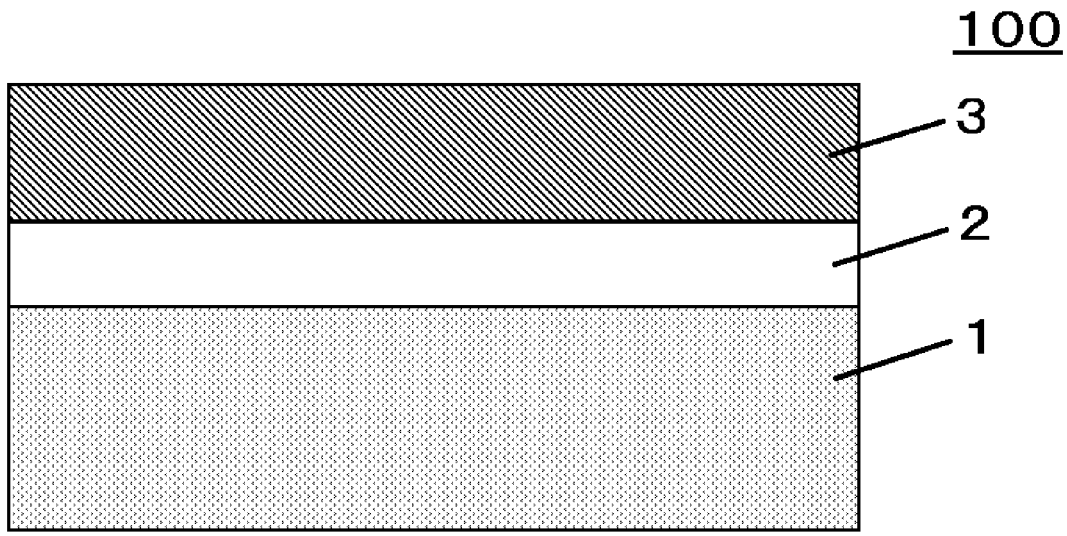
[FIG. 3]
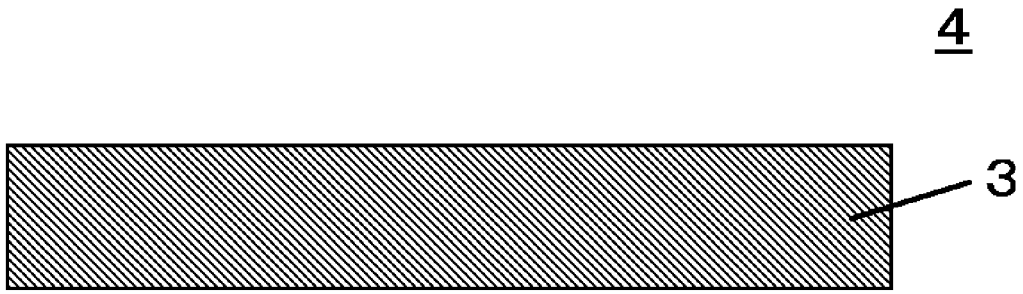

LAMINATE SUBSTRATE, FREESTANDING SUBSTRATE, METHOD FOR MANUFACTURING LAMINATE SUBSTRATE, AND METHOD FOR MANUFACTURING FREESTANDING SUBSTRATE

TECHNICAL FIELD

The present invention relates to a laminate substrate which has a single crystal diamond (111), a freestanding substrate, a method for manufacturing a laminate substrate and a method for manufacturing a freestanding substrate.

BACKGROUND ART

Diamond has a wide band gap of 5.47 eV at room temperature, and is known as a wide bandgap semiconductor.

Among semiconductors, diamond has extremely high dielectric breakdown electric field strength of 10 MV/cm, and a high-voltage operation can be performed. In addition, diamond has the highest thermal conductivity among known materials, and has an excellent heat radiation property thereby. Further, diamond has very large carrier mobility and saturated drift velocity, and is suitable for a high speed device.

Accordingly, diamond has the highest Johnson performance index, which indicates a property as a radio-frequency and high power device, compared to semiconductors such as silicon carbide and gallium nitride, and is said to be an ultimate semiconductor thereby.

Further, diamond has a phenomenon of nitrogen-vacancy center (NVC) within the crystal, and can manipulate and detect a single spin in room temperature, and has the characteristic that the condition can be imaged by photo detection magnetic resonance. Making use of this characteristic, application in a wide field of high-sensitivity sensors for magnetic field, electric field, temperature, and pressure, etc. is expected.

CITATION LIST

Non Patent Literature

Non Patent Document 1: M. Hatano et al., OYOBUTURI 85, 311 (2016)

PATENT LITERATURE

Patent Document 1: US Unexamined Patent publication No. US2013/0143022A1

SUMMARY OF INVENTION

Technical Problem

As described above, diamond is expected to be used practically as material for semiconductors or material for electronic and magnetic devices, and supply of a diamond substrate with a large area and high quality is desired. In particular, for use in a NVC device of high importance, the NV axis has to be highly oriented, and therefore, the diamond surface is preferably a (111) crystal surface with the NV axis aligned in a [111] direction (Non Patent Document 1). In addition, for example, considering application in an MRI field for medical purposes, a device that can measure a wider range efficiently can be realized with a diamond substrate that has a large diameter as the magnetic sensor portion. In addition, there is an advantage considering manufacturing costs.

However, currently, a diamond (111) crystal with a large area and high quality cannot be obtained. Presently, Ib type and IIa type diamond synthesized by a High Pressure and High Temperature (HPHT) method are known for use as a diamond substrate, but the Ib type diamond contains many nitrogen impurities. The IIa type diamond has a comparatively lowered amount of nitrogen impurities as volume average, but there is considerable non-uniformity depending on the part of the crystal. In addition, practicality is not high since diamond with a (111) surface is only obtained in sizes of up to about 8 mm diameter at most.

In Patent Document 1, a technology to form a diamond (111) crystal by heteroepitaxial growth using a chemical vapor deposition (CVD) method is reported. However, it is unclear whether the size and characteristics of the resulting diamond (111) crystal are on a sufficient level. In addition, including the technology described in Patent Document 1, there is no other information of being put to practical use.

The present invention was accomplished in order to solve the above problems, and it is an object of the present invention to provide a laminate substrate with a high-quality single crystal diamond (111) that has a large area (large diameter), high crystallinity, few hillocks, abnormal growth particles, and dislocation defects etc., high purity and low stress, applicable in electronic and magnetic devices, a large-diameter freestanding single crystal diamond (111) substrate, a method for manufacturing the laminate substrate, and a method for manufacturing the freestanding substrate.

Solution to Problem

The present invention was accomplished in order to achieve the above object and provides a laminate substrate which includes a single crystal diamond (111) layer, comprising: an underlying substrate, an intermediate layer on the underlying substrate, and the single crystal diamond (111) layer on the intermediate layer, wherein the underlying substrate has a main surface which has an off angle within a range, −8.0° or more and −0.5° or less, or +0.5° or more and +8.0° or less in a crystal axis [_1_1 2] direction or a threefold symmetry direction thereof relative to a crystal plane orientation of (111), and the single crystal diamond (111) layer has an off angle within a range, more than −10.5° and less than −2.0°, or more than +2.0° and less than +10.5° in the crystal axis [_1_1 2] direction or a threefold symmetry direction thereof relative to the crystal plane orientation of (111).

Such a laminate substrate will have a high-quality single crystal diamond (111) layer that has a large diameter, high crystallinity, few hillocks, abnormal growth particles, and dislocation defects etc., high purity and low stress, suitable for electronic and magnetic devices.

At this time, the intermediate layer of the laminate substrate may have an outermost surface which is a metal film selected from an Ir (111) film, a Rh (111) film, a Pd (111) film, and a Pt (111) film.

At this time, the underlying substrate of the laminate substrate may be a substrate consisting of a single Si, MgO, $Al_2O_3$, $SiO_2$, $Si_3N_4$, or SiC, or a laminated body selected from Si, MgO, $Al_2O_3$, $SiO_2$, $Si_3N_4$, or SiC.

This allows a laminate substrate with low manufacturing costs.

At this time, the underlying substrate of the laminate substrate may be MgO (111) or a MgO (111) layer may be further comprised between the underlying substrate and the intermediate layer.

This allows a laminate substrate which has a single crystal diamond (111) layer of higher quality.

At this time, the outermost surface of the intermediate layer of the laminate substrate may be a heteroepitaxially grown Ir (111) film, and the Ir (111) film may have a crystallinity wherein a half band width (FWHM) of a diffracted intensity peak at 2θ=40.7° assigned to Ir (111) analyzed by an X-ray diffraction method with a wavelength of λ=1.54 Å is 0.30° or less.

This allows a laminate substrate which has a single crystal diamond (111) layer of higher crystallinity.

At this time, the intermediate layer of the laminate substrate may have a thickness of 5.0 μm or less.

This reduces stress, and reduces concern for the occurrence of warps or cracks.

At this time, a surface of the metal film of the outermost surface of the intermediate layer of the laminate substrate, which is a film-forming surface of the single crystal diamond (111) layer may have an off angle within a range, −8.0° or more and −0.5° or less, or +0.5° or more and +8.0° or less in a crystal axis [_1_1 2] direction or a threefold symmetry direction thereof relative to a crystal plane orientation of (111).

In this way, the single crystal diamond (111) layer will have even higher crystallinity.

At this time, the single crystal diamond (111) layer of the laminate substrate may have a crystallinity wherein a half band width (FWHM) of a diffracted intensity peak at 2θ=43.9° assigned to diamond (111) analyzed by an X-ray diffraction method with a wavelength of λ=1.54 Å is 1° or less, and an FWHM of a rocking curve peak is 4° or less.

In this way, the laminate substrate will have higher quality and will be more suitable as a substrate for electronic and magnetic devices.

At this time, the single crystal diamond (111) layer of the laminate substrate may have, out of impurity concentrations analyzed by SIMS method, an oxygen concentration of $1 \times 10^{17}$ atoms/cm$^3$ or less and a nitrogen concentration of $5 \times 10^{16}$ atoms/cm$^3$ or less.

In this way, the laminate substrate becomes more suitable as a substrate for electronic and magnetic devices.

At this time, the single crystal diamond (111) layer of the laminate substrate may have a thickness of 100 μm or more.

In this way, the single crystal diamond (111) layer will have higher strength, and will easily become a freestanding substrate, removing the underlying substrate and the intermediate layer.

At this time, the laminate substrate may have a diameter of 10 mm or more.

This allows the formation of many elements on one chip, reduction of costs, and miniaturization of measuring devices.

At this time, the single crystal diamond (111) layer of the laminate substrate may have a surface whose arithmetic average roughness (Ra) is 2 nm or less.

Such a laminate substrate allows easy formation of elements, and is more suitable as a substrate for electronic and magnetic devices.

The present invention further provides a freestanding single crystal diamond (111) substrate, wherein the freestanding substrate has a main surface which has an off angle within a range, more than −10.5° and less than −2.0°, or more than +2.0° and less than +10.5° in a crystal axis [_1_1 2] direction or a threefold symmetry direction thereof relative to a crystal plane orientation of (111), and the freestanding substrate has a thickness of 100 μm or more.

This allows a high-quality freestanding single crystal diamond (111) substrate that has a large diameter, high crystallinity, few hillocks, abnormal growth particles, and dislocation defects etc., high purity and low stress, suitable for electronic and magnetic devices with a wide range of application such as high-sensitivity sensors of magnetic field, electric field, temperature, and pressure.

The present invention further provides a method for manufacturing a laminate substrate which includes a single crystal diamond (111) layer, comprising: a step of heteroepitaxially growing an intermediate layer on an underlying substrate whose main surface has an off angle within a range, −8.0° or more and −0.5° or less, or +0.5° or more and +8.0° or less in a crystal axis [_1_1 2] direction or a threefold symmetry direction thereof relative to a crystal plane orientation of (111), a nuclei formation step of forming diamond nuclei on a surface of the intermediate layer, and a step of heteroepitaxially growing, on the intermediate layer surface on which the nuclei are formed, a single crystal diamond (111) layer which has an off angle within a range, more than −10.5° and less than −2.0°, or more than +2.0° and less than +10.5° in a crystal axis [_1_1 2] direction or a threefold symmetry direction thereof relative to a crystal plane orientation of (111).

In this way, a laminate substrate with a high-quality single crystal diamond (111) layer that has a large diameter, high crystallinity, few hillocks, abnormal growth particles, and dislocation defects etc., high purity and low stress, suitable for electronic and magnetic devices is provided.

At this time, in the step of heteroepitaxially growing the intermediate layer, the intermediate layer may be a metal film selected from an Ir (111) film, a Rh (111) film, a Pd (111) film, and a Pt (111) film.

At this time, in the step of heteroepitaxially growing the single crystal diamond (111) layer, the diamond layer which is heteroepitaxially grown may have a thickness of 100 μm or more.

In this way, a laminate substrate that has a single crystal diamond (111) layer with higher strength can be manufactured.

At this time, in the step of heteroepitaxially growing the intermediate layer, a substrate which is MgO (111) crystal at least on an outermost surface may be used as the underlying substrate, and in the step of heteroepitaxially growing the intermediate layer, the intermediate layer may be heteroepitaxially grown by an R. F. magnetron sputtering method under conditions: a substrate temperature of 60° to 1200° C. and a pressure of $1.1 \times 10^{-1}$ Torr (14.7 Pa) to $9.0 \times 10^{-1}$ Torr (120.0 Pa).

In this way, a laminate substrate which has a single crystal diamond (111) layer of higher quality can be manufactured.

At this time, a freestanding single crystal diamond (111) substrate may be obtained by removing at least the intermediate layer and the underlying substrate from the laminate substrate obtained by the above method for manufacturing a laminate substrate.

In this way, a high-quality freestanding single crystal diamond (111) substrate that has a large diameter, high crystallinity, few hillocks, abnormal growth particles, and dislocation defects etc., high purity and low stress, suitable for electronic and magnetic devices with a wide range of application such as high-sensitivity sensors of magnetic field, electric field, temperature, and pressure can be provided.

Advantageous Effects of Invention

As described above, the inventive laminate substrate has a high-quality single crystal diamond (111) layer that has a large diameter, high crystallinity, few hillocks, abnormal growth particles, and dislocation defects etc., high purity and low stress, suitable for electronic and magnetic devices. The inventive freestanding substrate has a high-quality single crystal diamond (111) layer that has a large diameter, high crystallinity, few hillocks, abnormal growth particles, and dislocation defects etc., high purity and low stress, suitable for electronic and magnetic devices. In addition, the inventive method for manufacturing a laminate substrate can provide a method for manufacturing a laminate substrate that has a high-quality single crystal diamond (111) layer with a large diameter, high crystallinity, few hillocks, abnormal growth particles, and dislocation defects etc., high purity and low stress, suitable for electronic and magnetic devices.

BRIEF DESCRIPTION OF DRAWINGS

FIG. 1 is a drawing which explains plane orientation;

FIG. 2 shows an example of the inventive laminate substrate;

FIG. 3 shows an example of the inventive freestanding substrate.

DESCRIPTION OF EMBODIMENTS

Hereinafter, the present invention will be described in detail, but the present invention is not limited thereto.

As described above, obtention of a high quality single crystal diamond (111) layer that has a large diameter, high crystallinity, few hillocks, abnormal growth particles, and dislocation defects etc., high purity and low stress, suitable for electronic and magnetic devices has been required.

The present inventor has diligently investigated the above problems, and as a result, has found that a laminate substrate which includes a single crystal diamond (111) layer, comprising: an underlying substrate, an intermediate layer on the underlying substrate, and the single crystal diamond (111) layer on the intermediate layer, wherein the underlying substrate has a main surface which has an off angle within a range, −8.0° or more and −0.5° or less, or +0.5° or more and +8.0° or less in a crystal axis [_1_1 2] direction or a threefold symmetry direction thereof relative to a crystal plane orientation of (111), and the single crystal diamond (111) layer has an off angle within a range, more than −10.5° and less than −2.0°, or more than +2.0° and less than +10.5° in the crystal axis [_1_1 2] direction or a threefold symmetry direction thereof relative to the crystal plane orientation of (111) was a laminate substrate which has a high quality single crystal diamond (111) layer that has a large diameter, high crystallinity, few hillocks, abnormal growth particles, and dislocation defects etc., high purity and low stress, suitable for electronic and magnetic devices, and completed the present invention.

In addition, the present inventor has found that a freestanding single crystal diamond (111) substrate, wherein the freestanding substrate has a main surface which has an off angle within a range, more than −10.5° and less than −2.0°, or more than +2.0° and less than +10.5° in a crystal axis [_1_1 2] direction or a threefold symmetry direction thereof relative to a crystal plane orientation of (111), and the freestanding substrate has a thickness of 100 μm or more was a high quality freestanding single crystal diamond (111) substrate that has a large diameter, high crystallinity, few hillocks, abnormal growth particles, and dislocation defects etc., high purity and low stress, suitable for electronic and magnetic devices, and completed the present invention.

In addition, the present inventor has found that a laminate substrate which has a high quality single crystal diamond (111) layer that has a large diameter, high crystallinity, few hillocks, abnormal growth particles, and dislocation defects etc., high purity and low stress, suitable for electronic and magnetic devices can be obtained by a method for manufacturing a laminate substrate which includes a single crystal diamond (111) layer, comprising: a step of heteroepitaxially growing an intermediate layer on an underlying substrate whose main surface has an off angle within a range, −8.0° or more and −0.5° or less, or +0.5° or more and +8.0° or less in a crystal axis [_1_1 2] direction or a threefold symmetry direction thereof relative to a crystal plane orientation of (111), a nuclei formation step of forming diamond nuclei on a surface of the intermediate layer, and a step of heteroepitaxially growing, on the intermediate layer surface on which the nuclei are formed, a single crystal diamond (111) layer which has an off angle within a range, more than −10.5° and less than −2.0°, or more than +2.0° and less than +10.5° in a crystal axis [_1_1 2] direction or a threefold symmetry direction thereof relative to a crystal plane orientation of (111), and completed the present invention.

Hereinafter, the present invention will be described with reference to drawings.

Firstly, terms used in the present description will be defined.

In the present description, a crystal layer and a crystal film whose main surfaces are (111) surfaces will be called simply "(111) layer" and "(111) film". For example, a single crystal diamond layer whose main surface is a (111) surface will be called "single crystal diamond (111) layer".

The idea of off angles is shown in FIG. 1. FIG. 1 shows a conceptual diagram of the [_1_1 2] direction and the threefold symmetry directions thereof, [_1 2_1] and [2_1_1] directions and the off angle of a substrate whose main surface is a (111) surface. Incidentally, in the present description, a [1̄ 1̄ 2] direction will be written as a [_1_1 2] direction.

(Laminate Substrate)

A laminate substrate 100 of the present invention includes an underlying substrate 1, an intermediate layer 2 on the underlying substrate 1, and the single crystal diamond (111) layer 3 on the intermediate layer 2 as shown in FIG. 2. In FIG. 2, the underlying substrate 1 and the intermediate layer 2 are described as having one layer each, but they may have several layers each.

The underlying substrate 1 has a main surface which has an off angle within the range, −8.0° or more and −0.5° or less, or +0.5° or more and +8.0° or less in a crystal axis [_1_1 2] direction or a threefold symmetry direction thereof relative to a crystal plane orientation of (111). When the off angle is within such a range, growth progresses in the direction of the step of the single crystal diamond (111) crystal (crystal axis [_1_1 2] direction and the threefold symmetry directions thereof), and a favorable crystal can be obtained. If the off angle is within the range, more than −0.5° and less than +0.5°, growth in the direction of the step as described above cannot be easily performed, and a favorable crystal cannot be obtained. In addition, if the off angle is within the range, less than −8.0° and the range, more than +8.0°, growing for a long time causes polycrystallization, and a single crystal of good quality cannot be obtained.

The underlying substrate 1 is preferably a substrate consisting of a single Si, MgO, Al$_2$O$_3$, SiO$_2$, Si$_3$N$_4$, or SiC, or a laminated body selected from Si, MgO, Al$_2$O$_3$, SiO$_2$, Si$_3$N$_4$, or SiC. With these materials, it is easy to set the crystal plane orientation (including the off angle) of the main surface of the underlying substrate 1. The materials are also relatively cheap and can be acquired easily.

The underlying substrate 1 is preferably MgO (111) or a MgO (111) layer is further comprised between the underlying substrate 1 and the intermediate layer 2. An intermediate layer 2 and a single crystal diamond (111) layer 3 can be formed on the MgO (111).

The intermediate layer 2 may be one layer or a laminated body of several layers. An outermost surface of the intermediate layer 2 is preferably a metal film selected from an Ir (111) film, a Rh (111) film, a Pd (111) film, and a Pt (111) film. When such a metal film is used, diamond nuclei tend to have high density when a nucleation treatment (bias treatment) is performed, and this is favorable since the single crystal diamond (111) layer 3 is more easily formed thereon.

The intermediate layer 2 is more preferably a heteroepitaxially grown Ir (111) film. At this time, the single crystal diamond (111) layer 3 will have higher crystallinity if the Ir (111) film has a crystallinity in which a half band width (FWHM) of a diffracted intensity peak at 2θ=40.7° assigned to Ir (111) analyzed by an X-ray diffraction method with a wavelength of λ=1.54 Å is 0.30° or less.

The intermediate layer 2 preferably has an off angle within the range, ±0.5 to ±8.0° in a crystal axis [_1_1 2] direction or a threefold symmetry direction thereof relative to a crystal plane orientation of (111) With such an off angle, growth is more inclined to progress in the direction of the step of the single crystal diamond (111) layer 3 ([_1_1 2] direction and the threefold symmetry directions thereof), and a favorable crystal growth can be obtained. That is, the single crystal diamond (111) layer 3 becomes smooth, with no abnormal growth.

The thickness of the intermediate layer 2 is preferably 5.0 μm or less. With such a range, the stress becomes smaller, and there is less concern for the occurrence of warps or cracks.

As favorable examples of the underlying substrate 1 and the intermediate layer 2, for example, a MgO (111) substrate may be used as the underlying substrate 1 and an Ir (111) film may be heteroepitaxially grown on the MgO (111) substrate, or a Si (111) substrate may be used as the underlying substrate 1, and after heteroepitaxially growing a MgO (111) layer on the Si (111) substrate, an Ir (111) film may further be heteroepitaxially grown.

The single crystal diamond (111) layer 3 has an off angle within a range, more than −10.5° and less than −2.0°, or more than +2.0° and less than +10.5° in the crystal axis [_1_1 2] direction or a threefold symmetry direction thereof relative to the crystal plane orientation of (111). As a result of diligent research, the present inventor has found that the off angle of the single crystal diamond (111) layer 3 is larger than the off angle of the underlying substrate 1 by more than 1.5° and less than 2.5°. For this reason, the off angle of the single crystal diamond (111) layer 3 which is heteroepitaxially grown on the underlying substrate 1 that has an off angle as described above becomes larger than the off angle of the underlying substrate 1 by more than 1.5° and less than 2.5°. Conversely, an underlying substrate 1 which has an off angle within a range that allows obtention of a good quality film and has an off angle that is smaller than the target off angle of the single crystal diamond (111) layer 3 by more than 1.5° and less than 2.5° may be used.

The off angle of the single crystal diamond (111) layer 3 is more preferably within the range, −8.0° or more and −3.0° or less, or +3.0° or more and +8.0° or less in the crystal axis [_1_1 2] direction or a threefold symmetry direction thereof. A single crystal diamond (111) layer 3 which has an off angle of such a range is of higher quality, and is more suitable as a substrate for electronic and magnetic devices.

The impurity concentration of the single crystal diamond (111) layer 3 is preferably: an oxygen concentration of $1 \times 10^{17}$ atoms/cm$^3$ or less and a nitrogen concentration of $5 \times 10^{16}$ atoms/cm$^3$ or less when analyzed by SIMS method. Such impurity concentration is suitable for a substrate for electronic and magnetic devices.

The thickness of the single crystal diamond (111) layer 3 is preferably 100 μm or more. A single crystal diamond (111) layer 3 with such a thickness has higher strength, and can easily become a freestanding substrate 4 as in FIG. 3, removing the underlying substrate 1 and the intermediate layer 2.

The diameter of the laminate substrate 100 is preferably 10 mm or more. Such a substrate with a large diameter, that is, a large area, allows the formation of many elements on one chip, reduction of costs, and miniaturization of measuring devices.

The arithmetic average roughness (Ra) of the surface of the single crystal diamond (111) layer 3 is preferably 2 nm or less. A laminate substrate 100 provided with a single crystal diamond (111) layer 3 which has such a surface arithmetic average roughness (Ra) allows easy formation of elements, and is suitable as a substrate for electronic and magnetic devices.

(Freestanding Substrate)

As stated above, a freestanding substrate 4 can be obtained by removing the underlying substrate 1 and the intermediate layer 2 (FIG. 3). With a freestanding substrate 4, which does not have an underlying substrate 1 or an intermediate layer 2, there is no hetero interface, which becomes the source of noise, and the range of application becomes wider; not only for use for electronic devices, but also for high-sensitivity sensors of magnetic field, electric field, temperature, pressure, etc.

(Method for Manufacturing a Laminate Substrate)

Next, the inventive method for manufacturing a laminate substrate 100 will be described.

Firstly, the above-described underlying substrate 1 is prepared. Next, an intermediate layer 2 is heteroepitaxially grown on the underlying substrate 1. The method of heteroepitaxial growth is not particularly limited. For example, when the above intermediate layer 2 is a metal film, electron beam evaporation method and the sputtering method, etc. are possible. The R. F. magnetron sputtering method is favorable since the growth rate is relatively high and a favorable crystallinity can be obtained. Growth conditions can be set appropriately according to the type of film, but as typical conditions, a substrate temperature of 600 to 1200° C. and a pressure of $1.1 \times 10^{-1}$ Torr (14.7 Pa) to $9.0 \times 10^{-1}$ Torr (120.0 Pa) allows heteroepitaxial growth of a high-quality metal film.

After forming, for example, a metal film as the intermediate layer 2, a nucleation treatment is performed in which diamond nuclei are formed on the surface of the intermediate layer 2. Formation of diamond is promoted by performing the nucleation treatment. This nucleation treatment is performed by, for example, biasing the substrate while performing a plasma treatment in a gas atmosphere containing carbon.

After forming nuclei on the surface of the intermediate layer 2, a single crystal diamond (111) layer 3 is heteroepitaxially grown. A chemical vapor deposition method (CVD method) is suitable for this growth, and for example, a microwave plasma CVD method, a direct current plasma CVD method, a hot-filament CVD method, and an arc discharge plasma jet CVD method, etc. are possible. A diamond obtained by these growing methods is a high-quality single crystal diamond with high crystallinity, few hillocks, abnormal growth particles and dislocation defects, and has high purity and low stress. Among these, the direct current plasma CVD method is suitable since it allows swift growth with high purity and high crystallinity. In this way, a laminate substrate 100 with an underlying substrate 1, an intermediate layer 2, and a single crystal diamond (111) layer 3 laminated can be manufactured.

When applying the single crystal diamond (111) layer 3 to various devices etc., if a thin single crystal diamond (111) layer 3 is sufficient, then it may be used as single crystal diamond (111) layer 3/intermediate layer 2/underlying substrate 1, in order to hold the single crystal diamond (111) layer 3 stably.

(Method for Manufacturing a Freestanding Substrate)

If the existence of the materials of the intermediate layer 2 and below become the cause of noise in using as magnetic sensors etc., the single crystal diamond (111) layer 3 alone may be taken out as a freestanding single crystal diamond (111) substrate 4. By removing the underlying substrate 1 and the intermediate layer 2 from the laminate substrate 100 obtained as described above, a freestanding single crystal diamond (111) substrate 4 can be obtained. The removal of the underlying substrate 1 and the intermediate layer 2 is not particularly limited. A mechanical treatment such as polishing or a wet or dry etching treatment etc. may be appropriately selected according to the materials of the underlying substrate 1 and the intermediate layer 2. The above treatments may also be combined.

In addition, smoothing the surface of the laminate substrate 100 which has the above single crystal diamond (111) layer 3 formed or the above freestanding substrate 4 is also effective for application to electronic and magnetic devices etc. This makes the formation of an element easier. For smoothing the surface, mechanical polishing, CMP, or dry etching such as plasma etching etc. are possible.

Example

Hereinafter, the present invention will be described in detail with reference to an Example, but the present invention is not limited thereto.

Example

As an underlying substrate, a single crystal MgO substrate polished on one side which has a diameter of 20.0 mm, a thickness of 1.0 mm, a main surface that is a (111) surface and an off angle of 2° in a crystal axis [_1_1 2] direction (hereinafter referred to as "single crystal MgO (111) substrate") was prepared.

Next, an intermediate layer of a single crystal Ir film was formed by R. F. magnetron sputtering method on the surface of the prepared single crystal MgO (111) substrate. The single crystal Ir film was formed by a radio-frequency (RF) magnetron sputtering method (13.56 MHz) with targeting at Ir which has a diameter of 6 inches (150 mm), a thickness of 5.0 mm, and purity of 99.9% or more.

The single crystal MgO (111) substrate, which is an underlying substrate was heated to 800° C., and after it was confirmed that the base pressure had become $6 \times 10^{-7}$ Torr (about $8.0 \times 10^{-5}$ Pa) or lower, 50 sccm of Ar gas was introduced. Next, after making the pressure $3 \times 10^{-1}$ Torr (about 39.9 Pa) by adjusting the aperture of the valve connected to the exhaust system, film formation was performed for 15 minutes by inputting RF power of 1000 W. In this way, a single crystal Ir film with a thickness of 1.0 μm was obtained.

A single crystal MgO (111) substrate on which a single crystal Ir film is laminated in the way described above grows heteroepitaxially in accordance with the off angle of the single crystal MgO substrate. This single crystal Ir film was analyzed by an X-ray diffraction method with a wavelength of λ=1.54 Å, and the surface was a (111) surface and there was an off angle of 2° in the crystal axis [_1_1 2] direction. In addition, the half width (FWHM) of the diffracted peak at 2θ=40.7°, assigned to Ir (111) was 0.187°. Hereinafter, this single crystal Ir film will be referred to as "Ir (111) film".

Next, as pre-treatment for forming diamond nuclei, a nucleation treatment (bias treatment) was performed. The substrate was set on a planar electrode with a diameter of 25 mm inside a treatment chamber with the Ir (111) film side facing upwards. After it was confirmed that the base pressure had become $1 \times 10^{-6}$ Torr (about $1.3 \times 10^{-4}$ Pa) or lower, hydrogen-diluted methane gas ($CH_4/(CH_4+H_2)$=5.0 vol. %) was introduced into the treatment chamber at a flow rate of 500 sccm. After making the pressure 100 Torr (about $1.3 \times 10^4$ Pa) by adjusting the aperture of the valve connected to the exhaust system, a negative voltage was applied to an electrode at the substrate side to expose to plasma for 90 seconds, and thereby the substrate (Ir (111) film) surface was subjected to bias treatment.

Diamond was heteroepitaxially grown on the Ir (111) film/single crystal MgO (111) substrate produced as described above by a direct current plasma CVD method. The Ir (111) film/single crystal MgO (111) substrate subjected to bias treatment was set inside the chamber of a direct current plasma CVD apparatus, and after exhausting was performed using a rotary pump until the base pressure became $10^{-3}$ Torr (about $1.3 \times 10^{-1}$ Pa) or lower, hydrogen-diluted methane gas ($CH_4/(CH_4+H_2)$=5.0 vol. %) was introduced into the chamber as a source gas at a flow rate of 1000 sccm. After making the pressure inside the chamber 110 Torr (about $1.5 \times 10^4$ Pa) by adjusting the aperture of the valve connected to the exhaust system, film formation was performed for 30 hours by sending a direct current of 6.0 Å, whereby the film formation was performed until the thickness reached about 200 μm. The temperature of the substrate during film formation was measured by a pyrometer, and it was 950° C. In this way, a diamond layer was heteroepitaxially grown on the Ir (111) film/single crystal MgO (111) substrate, and a laminate substrate was obtained.

Regarding the obtained diamond layer, X-ray diffraction analysis was performed with an incident wavelength of 1.54 Å, and the FWHM of the diffracted intensity peak and the FWHM of the rocking curve peak at 2θ=43.9°, assigned to diamond (111) were respectively 0.212° and 0.583°. The diamond layer grew heteroepitaxially in accordance with the off angle of the Ir (111) film. Hereinafter, this diamond layer will be referred to as "single crystal diamond (111) layer".

The impurity concentration of the single crystal diamond (111) layer was analyzed by SIMS method, and oxygen concentration was $[O] \leq 1 \times 10^{17}$ atoms/cm$^3$, and nitrogen concentration was $[N] \leq 5 \times 10^{16}$ atoms/cm$^3$. Incidentally, both elements were below the lower measurement limit of the device. In addition, optical microscope and SEM observation was performed, and no crystal defects such as hillocks and abnormal growth particles were found. Even in a single crystal diamond (111) layer/Ir (111) film/single crystal MgO (111) substrate form, there were no cracks or warps.

Subsequently, the Ir (111) film/single crystal MgO (111) substrate was removed to make a freestanding substrate. Firstly, after removing the single crystal MgO (111) substrate by etching, the Ir (111) film was removed by polishing. As a result, a freestanding single crystal diamond (111) substrate with a diameter of 20 mm and a thickness of about 200 μm was obtained.

Lastly, the surface of the freestanding single crystal diamond (111) substrate was polished. Measuring using a probe type surface roughness tester (Dektak made by Bruker Corporation) by 500 μm scanning, the arithmetic average roughness (Ra) was 0.5 nm.

Here, a 3 μm thick nitrogen-doped diamond layer was formed on the surface of the obtained polished freestanding single crystal diamond (111) substrate with a diameter of 20 mm and a thickness of 180 μm by a microwave CVD method, mixing nitrogen gas with hydrogen-diluted methane source gas. The nitrogen-doped diamond layer was analyzed by SIMS, and the nitrogen concentration in the nitrogen-doped diamond layer was $[N]=1\times10^{19}$ atoms/cm$^3$.

Subsequently, in order to evaluate NVC phenomenon, photoluminescence (PL) analysis, photo detection magnetic resonance analysis, and confocal microscope observation of light detected from an NV center were performed, and it was confirmed that there was sufficient practicality for use in a magnetic sensor device.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A laminate substrate which includes a single crystal diamond (111) layer, comprising:
    an underlying substrate, an intermediate layer on the underlying substrate, and the single crystal diamond (111) layer on the intermediate layer, wherein
    the underlying substrate has a main surface which has an off angle within a range, −8.0° or more and −0.5° or less, or +0.5° or more and +8.0° or less in a crystal axis [_1_1 2] direction or a threefold symmetry direction thereof relative to a crystal plane orientation of (111), and
    the single crystal diamond (111) layer has an off angle within a range, more than −10.5° and less than −2.0°, or more than +2.0° and less than +10.5° in the crystal axis [_1_1 2] direction or a threefold symmetry direction thereof relative to the crystal plane orientation of (111),
    wherein the intermediate layer has an outermost surface that is a heteroepitaxially grown Ir (111) film, and the Ir (111) film has a crystallinity wherein a half band width (FWHM) of a diffracted intensity peak at 2θ=40.7° assigned to Ir (111) analyzed by an X-ray diffraction method with a wavelength of λ=1.54 Å is 0.30° or less.

2. The laminate substrate according to claim 1, wherein the underlying substrate is a substrate consisting of a single Si, MgO, Al$_2$O$_3$, SiO$_2$, Si$_3$N$_4$, or SiC, or a laminated body selected from Si, MgO, Al$_2$O$_3$, SiO$_2$, Si$_3$N$_4$, or SiC.

3. The laminate substrate according to claim 1, wherein the underlying substrate is MgO (111) or a Mg (111) layer is further comprised between the underlying substrate and the intermediate layer.

4. The laminate substrate according to claim 1, wherein the intermediate layer has a thickness of 5.0 μm or less.

5. The laminate substrate according to claim 1, wherein a surface of the Ir (111) film of the outermost surface of the intermediate layer, which is a film-forming surface of the single crystal diamond (111) layer has an off angle within a range, −8.0° or more and −0.5° or less, or +0.5° or more and +8.0° or less in a crystal axis [_1_1 2] direction or a threefold symmetry direction thereof relative to a crystal plane orientation of (111).

6. The laminate substrate according to claim 1, wherein the single crystal diamond (111) layer has a crystallinity wherein a half band width (FWHM) of a diffracted intensity peak at 2θ=43.9° assigned to diamond (111) analyzed by an X-ray diffraction method with a wavelength of λ=1.54 Å is 1° or less, and an FWHM of a rocking curve peak is 4° or less.

7. The laminate substrate according to claim 1, wherein the single crystal diamond (111) layer has, out of impurity concentrations analyzed by SIMS method, an oxygen concentration of $1\times10^{17}$ atoms/cm$^3$ or less and a nitrogen concentration of $5\times10^{16}$ atoms/cm$^3$ or less.

8. The laminate substrate according to claim 1, wherein the single crystal diamond (111) layer has a thickness of 100 μm or more.

9. The laminate substrate according to claim 1, wherein the laminate substrate has a diameter of 10 mm or more.

10. The laminate substrate according to claim 1, wherein the single crystal diamond (111) layer has a surface whose arithmetic average roughness (Ra) is 2 nm or less.

* * * * *